United States Patent
Sakurada et al.

(10) Patent No.: US 7,384,477 B2
(45) Date of Patent: Jun. 10, 2008

(54) METHOD FOR PRODUCING A SINGLE CRYSTAL AND A SINGLE CRYSTAL

(75) Inventors: Masahiro Sakurada, Fukushima (JP); Makoto Iida, Fukushima (JP); Nobuaki Mitamura, Fukushima (JP); Atsushi Ozaki, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 113 days.

(21) Appl. No.: 10/560,581

(22) PCT Filed: May 28, 2004

(86) PCT No.: PCT/JP2004/007350

§ 371 (c)(1),
(2), (4) Date: Feb. 2, 2006

(87) PCT Pub. No.: WO2005/001171

PCT Pub. Date: Jan. 6, 2005

(65) Prior Publication Data

US 2007/0017433 A1 Jan. 25, 2007

(30) Foreign Application Priority Data

Jun. 27, 2003 (JP) ............................. 2003-185773

(51) Int. Cl.
*C30B 15/20* (2006.01)
(52) U.S. Cl. ............................. 117/20; 117/19; 117/105
(58) Field of Classification Search .................. 117/19, 117/20, 105
See application file for complete search history.

(56) References Cited

U.S. PATENT DOCUMENTS

| 6,190,452 B1 * | 2/2001 | Sakurada et al. ............. 117/20 |
| 6,197,109 B1 * | 3/2001 | Iida et al. ..................... 117/19 |
| 6,913,646 B2 * | 7/2005 | Sakurada et al. ............. 117/13 |
| RE39,173 E * | 7/2006 | Hourai et al. ................ 428/450 |

(Continued)

FOREIGN PATENT DOCUMENTS

JP A 08-268794 10/1996

(Continued)

OTHER PUBLICATIONS

V. V. Voronkov, "The mechanism of Swirl Defects formation in Silicon," Journal of Crystal Growth, 59 (1982), 625-643.

(Continued)

*Primary Examiner*—Felisa C Hiteshew
(74) *Attorney, Agent, or Firm*—Oliff & Berridge, PLC (57) ABSTRACT

The present invention is a method for producing a single crystal with pulling the single crystal from a raw material melt in a chamber by CZ method, wherein when growing the single crystal, where a pulling rate is defined as V and a temperature gradient of the crystal is defined as G during growing the single crystal, the temperature gradient G of the crystal is controlled by changing at least two or more of pulling conditions. Thereby, there is provided a method for producing a single crystal in which when the single crystal is grown by CZ method, V/G can be controlled without lowering a pulling rate V, and thus the single crystal including a desired defect region can be produced effectively for a short time.

18 Claims, 5 Drawing Sheets

U.S. PATENT DOCUMENTS 7,294,196 B2 * 11/2007 Sakurada et al. ............. 117/20

FOREIGN PATENT DOCUMENTS

| JP | A 08-330316 | 12/1996 |
| JP | A 11-147786 | 6/1999 |
| JP | A 2000-063196 | 2/2000 |
| JP | A 2000-313691 | 11/2000 |
| JP | A 2002-338389 | 11/2002 |
| JP | A 2003-002786 | 1/2003 |

OTHER PUBLICATIONS

F. Dupret et al., "Global Modelling of Heat Transfer in Crystal Growth Furnaces," Int. J. Heat Mass Transfer, vol. 33, No. 9, pp. 1849-1871, 1990.

* cited by examiner

Fig.1 a diameter of a straight body of a single crystal (mm)

Fig.2 a rotation rate of a single crystal (rpm)

Fig.3 a flow rate of an inert-gas (L / min)

Fig.4 a relative distance L2 between a heating center of a heater
and a surface of a raw material melt (mm)

Fig.5 a distance L1 between a surface of a raw material melt and a heat insulating member (mm)

METHOD FOR PRODUCING A SINGLE CRYSTAL AND A SINGLE CRYSTAL

TECHNICAL FIELD

The present invention relates to a method for producing a single crystal by Czochralski Method, more particularly to a method for producing a single crystal including a desired defect region.

BACKGROUND TECHNOLOGY

A single crystal used as a substrate of semiconductor devices is, for example, a silicon single-crystal. It is mainly produced by Czochralski Method (referred to as CZ method for short hereafter). In recent years, semiconductor devices have come to be integrated higher and devices have come to be decreased in size. Along with that, a problem of Grown-in defects introduced during growth of a single crystal has become more important.

Figure 7:
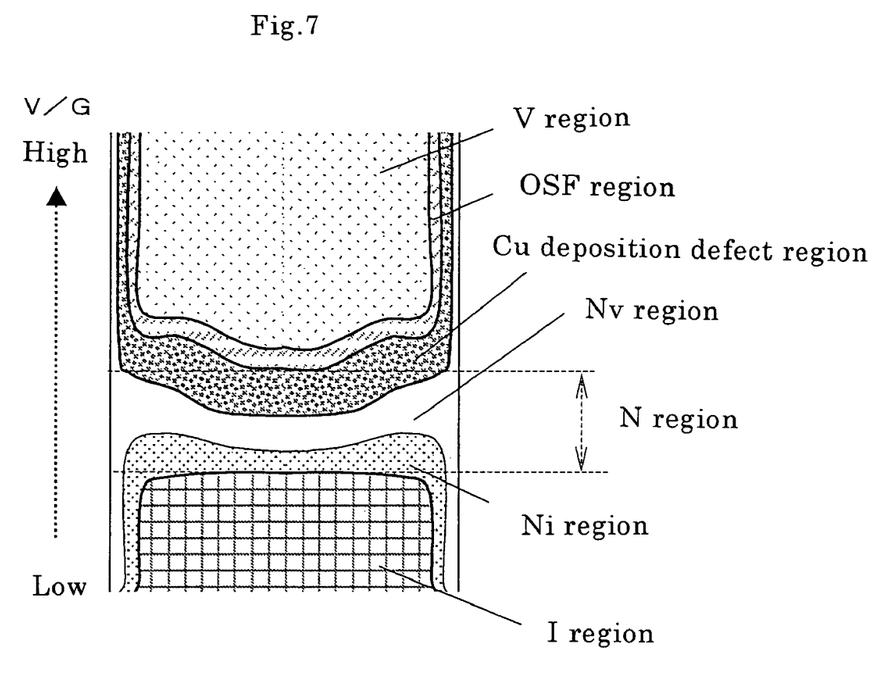
FIG. 7 is an explanatory view showing a relationship between V/G and a distribution of crystal defects.

Hereafter, Grown-in defects will be explained with reference to FIG. 7.

Generally, in the case of growing a silicon single crystal, when a growth rate V of the crystal (a pulling rate of the crystal) is relatively high, there exist Grown-in defects such as FPD (Flow Pattern Defect) and COP (Crystal Originated Particle), which are considered due to voids consisting of agglomerated vacancy-type point defects, at a high density over the entire radial direction of the crystal. The region containing these defects due to voids is referred to as V (Vacancy) region.

Furthermore, when the growth rate of the crystal is lowered, along with lowering of the growth rate, an OSF (Oxidation Induced Stacking Fault) region is generated from the periphery of the crystal in a ring shape. When the growth rate is further lowered, the OSF ring shrinks to the center of the wafer and disappears. When the growth rate is further lowered, there exist defects such as LSEPD (Large Secco Etch Pit Defect) and LFPD (Large Flow Pattern Defect), which are considered due to dislocation loops consisting of agglomerated interstitial silicon atoms, at a low density. The region where these defects exist is referred to as I (Interstitial) region.

In recent years, a region containing no defects like FPD and COP due to voids as well as no defects like LSEPD and LFPD due to interstitial silicon atoms has been found between the V region and the I region and also outside the OSF ring. This region is referred to as N (Neutral) region. In addition, it has been found that when further classifying the N region, there exist Nv region (the region where a lot of vacancies exist) adjacent to the outside of the OSF ring and Ni region (the region where a lot of interstitial silicon atoms exist) adjacent to the I region, and that when performing thermal oxidation treatment, a lot of oxide precipitates are generated in the Nv region and little oxide precipitates are generated in the Ni region.

Furthermore, it has been found that, after performing the thermal oxidation treatment, there exist a region where defects detected by Cu deposition treatment are particularly generated (hereinafter referred to as Cu deposition defect region) in a portion of the Nv region where oxygen precipitation tends to be generated, and the Cu deposition defect region causes degradation of electric property like oxide dielectric breakdown voltage characteristics.

It is considered that introduction amount of these Grown-in defects is determined by a parameter of V/G ($mm^2/°$C.·min) which is a ratio of a pulling rate V (mm/min) when a single crystal is grown and a temperature gradient G (°C./mm) of the crystal in the direction of pulling axis from melting point of silicon to 1400° C. at the vicinity of solid-liquid interface (for example, see V. V. Voronkov, Journal of Crystal Growth, 59 (1982), 625-643). Therefore, a single crystal is grown with controlling V/G to be a determined value constantly, and thus a single crystal including a desired defect region or a desired defect-free region can be produced.

For example, in Japanese Patent Laid-open (Kokai) No. H11-147786, it is disclosed that, when a silicon single crystal is grown, the single crystal is pulled with controlling V/G in a determined range (for example, 0.112-0.142 $mm^2/°$C.·min) at the center of the crystal, and thus a silicon single crystal wafer without defects due to voids and defects due to dislocation loops can be obtained. Furthermore, in recent years, the demand for a defect-free crystal of N region without Cu deposition defect region has become higher. And it has been demanded a production of a single crystal in which the single crystal is pulled with controlling V/G to be a desired defect-free region with high precision.

Generally, temperature gradient G of a crystal in a direction of a pulling axis is considered to be determined only by HZ (hot zone: a furnace structure) of an apparatus for pulling a single crystal in which the single crystal is grown. However, it is extremely difficult to change HZ while pulling a single crystal. Therefore, when a single crystal is grown with controlling V/G as described above, the temperature gradient G of the crystal isn't controlled during pulling the single crystal. However, V/G is controlled by adjusting the pulling rate V and a single crystal including a desired defect region is produced.

In addition, it has been known that the temperature gradient G of the crystal generally tends to lower as a single crystal grows, and thus the temperature gradient G of the crystal becomes smaller at the end of growing the straight body of the single crystal than at the start of growing the straight body of the single crystal. Therefore, in order to control V/G to be a desired value almost constantly, as the single crystal grows, a pulling rate V has to be changed to be a lower rate according to fluctuation (decline) of the temperature gradient G of the crystal. As a result, time for growing a straight body of a single crystal lengthens, and thus there is a problem that productivity is lowered.

Furthermore, the pulling rate at the end of growing a straight body of a single crystal influences a pulling rate and pulling time of the single crystal at the subsequent tailing process to form a tail of the single crystal. Therefore, if the pulling rate is lowered at the end of growing a straight body of a single crystal as described above, the pulling rate at the tailing process is also lowered and pulling time is further drawn out. Accordingly, there is a problem that productivity in producing a single crystal is extremely lowered and it leads to raise of production cost.

DISCLOSURE OF THE INVENTION

The present invention was accomplished in view of the aforementioned circumstances, and its object is to provide a method for producing a single crystal in which when the single crystal is grown by CZ method, V/G is controlled by controlling fluctuation of a temperature gradient G of the crystal which is being pulled without lowering a pulling rate V, thereby the single crystal including a desired defect region can be produced effectively for a short time.

The present invention was accomplished to achieve the aforementioned object, and there is provided a method for producing a single crystal with pulling the single crystal from a raw material melt in a chamber by Czochralski method, wherein when growing the single crystal, where a pulling rate is defined as V (mm/min) and a temperature gradient of the crystal in the direction of pulling axis at the vicinity of solid-liquid interface is defined as G (° C./mm) during growing a straight body of the single crystal, the temperature gradient G of the crystal is controlled by changing at least two or more of pulling conditions including a diameter of the straight body of the single crystal, a rotation rate of the single crystal during pulling the single crystal, a flow rate of an inert-gas introduced into the chamber, a position of a heater heating the raw material melt and a distance between a melt surface of the raw material melt and a heat insulating member provided in the chamber so as to oppose to the surface of the raw material melt, thereby V/G ($mm^2$/° C.·min) which is a ratio of the pulling rate V and the temperature gradient G of the crystal is controlled so that a single crystal including a desired defect region is grown.

As described above, when a single crystal is grown by CZ method, at least two or more of pulling conditions including a diameter of the straight body of the single crystal, a rotation rate of the single crystal, a flow rate of an inert-gas, a position of a heater and a distance between the surface of the raw material melt and a heat insulating member is changed, and thus the temperature gradient G of the crystal can be controlled in a very wide range and with extremely high precision. Thereby, V/G can be controlled with high precision without lowering the pulling rate V, and a single crystal including a desired defect region can be produced effectively for a short time. And if a single crystal can be produced effectively as described above, productivity for producing a single crystal can be improved and cost can be reduced.

At this time, it is possible that the single crystal is pulled with keeping the pulling rate V constant.

According to the method for producing a single crystal of the present invention, the temperature gradient G of the crystal can be controlled in a wide range with high precision by changing at least two or more of the pulling conditions shown above. Thereby, even if a single crystal is pulled with keeping the pulling rate V constant, V/G can be controlled easily and surely so as to grow a single crystal of a desired defect region. Therefore, a single crystal having the same defect region in the direction of the crystal growth axis can be pulled easily with keeping the pulling rate V high constantly. In addition, keeping the pulling rate V constant in the present invention means that each average pulling rate at respective portions of the straight body of the single crystal is kept constant. If each average pulling rate at respective portions of the single crystal is kept constant, in order to control a diameter of the single crystal to be a predetermined value with high precision, V can be changed in the predetermined range to average pulling rate at respective portions of the crystal.

In these cases, it is preferable that V/G is controlled so that the defect region of the single crystal to be grown is N region over a whole plane in a radial direction.

As described above, by controlling V/G so that the defect region of the single crystal is N region over a whole plane in a radial direction, a single crystal with very high quality containing no defects like FPD and COP due to voids as well as no defects like LSEPD and LFPD due to dislocation loops can be produced at a high level of productivity.

In addition, in the present invention, it is preferable that at least two or more of the pulling conditions are changed automatically according to changing conditions obtained by performing an experiment beforehand.

As described above, when at least two or more of the pulling conditions shown above are changed to control the temperature gradient G of the crystal, a state of the temperature gradient G of the crystal at a production environment in which a single crystal is practically produced, relations between respective pulling conditions and the temperature gradient G of the crystal etc. are examined by performing simulation analyses or tests like practical production beforehand. And based on thus-obtained data, changing conditions like selection of pulling conditions to be changed practically, degree of changing the pulling conditions and so on are obtained. Then, the selected pulling conditions are changed according to the changing conditions during pulling the single crystal, and thus the temperature gradient G of the crystal can be controlled automatically with high precision, thereby a single crystal including a desired defect region can be grown at a high rate of stability.

Furthermore, it is preferable that the changing conditions that change at least two or more of the pulling conditions are adjusted among batches for producing the single crystal.

Generally, when production of a single crystal is repeated for plural batches, there is a case that a production environment changes among batches for producing the single crystal because of degradation or the like of parts comprising HZ of an apparatus for pulling a single crystal. However, in the present invention, the changing conditions that change at least two or more of the pulling conditions are adjusted among batches for producing the single crystal, and thus the change of a production environment can be compensated. Thereby, even if production of a single crystal is repeated for plural batches, quality does not vary among batches and a single crystal can be produced at a high rate of stability.

In these cases, a silicon single crystal is pulled as the single crystal.

As described above, in particular, the method for producing a single crystal according to the present invention is preferably applicable to the case of producing a silicon single crystal. Thereby, V/G can be controlled without lowering the pulling rate V, and a silicon single crystal including a desired defect region can be produced effectively for a short time.

And, according to the present invention, a single crystal produced by above method for producing a single crystal is provided.

The single crystals produced by the present invention can be single crystals with very high quality including a desired defect region. Furthermore, the single crystals produced by the present invention are provided at lower price than usual because they are produced effectively for a short time.

As mentioned above, according to the present invention, when a single crystal is pulled, at least two or more of the pulling conditions shown above are changed, thereby the temperature gradient G of the crystal can be controlled in a wide range with high precision, thereby V/G can be controlled with high precision without depending on the pulling rate V. Accordingly, a single crystal including a desired defect region can be grown with keeping the pulling rate V constant without lowering the pulling rate V, and thus a single crystal can be produced effectively in a shorter time than usual. Thereby, productivity in producing a single crystal can be improved without lowering yield, and costs can be considerably reduced.

BEST MODE FOR CARRYING OUT THE INVENTION

Hereinafter, embodiments of the present invention will be explained. However, the present invention is not limited thereto.

The present inventors considered that, in order to produce a single crystal including a desired defect region effectively for a short time, V/G is controlled by controlling the temperature gradient G of the crystal. Then, they gave attention to a diameter of the straight body of the single crystal to be grown, a rotation rate of rotating the single crystal during pulling the single crystal, a flow rate of an inert-gas introduced into a chamber during growing the single crystal, a position of a heater heating a raw material melt during growing the single crystal, and a distance between a melt surface of the raw material melt and a heat insulating member provided so as to oppose to the surface of the raw material melt.

Then, the present inventors performed thorough experiments and investigations. Consequently, they have found that by changing intentionally respective pulling conditions shown above during pulling a single crystal, a temperature gradient G of the crystal in the direction of a pulling axis from melting point of silicon to 1400° C. at the vicinity of solid-liquid interface can be controlled. Then, they have found that thus controlling the temperature gradient G of the crystal during pulling the single crystal, thereby V/G can be controlled without changing the pulling rate to a lower rate.

Here shown in FIGS. 1-5 are respective examples of the results of simulation analyses using the global heat transfer analysis software FEMAG (F. Dupret, P. Nicodeme, Y. Ryckmans, P. Wouters, and M. J. Crochet, Int. J. Heat Mass Transfer, 33, 1849 (1990)) in the case of growing a single crystal, in respect to fluctuation of a temperature gradient G of the crystal when a diameter of the straight body of the single crystal is changed, fluctuation of a temperature gradient G of the crystal when a rotation rate of rotating the single crystal is changed, fluctuation of a temperature gradient G of the crystal when a flow rate of an inert-gas introduced into the chamber is changed, fluctuation of a temperature gradient G of the crystal to a relative distance L2 between the heating center of the heater and the melt surface of the raw material melt when a position of the heater heating the raw material melt is changed, and fluctuation of a temperature gradient G of the crystal when a distance L1 between the melt surface of the raw material melt and the heat insulating member provided in the chamber is changed during pulling the single crystal.

As shown in FIGS. 1-5, as a result of the simulation analyses, it has been revealed that a temperature gradient G of the crystal fluctuates by changing respective pulling conditions shown above. For example, it has been found that, during pulling a single crystal, the temperature gradient G of a crystal can become larger by narrowing the diameter of the straight body of the single crystal, increasing the rotation rate of the single crystal, increasing the flow rate of an inert-gas, changing the position of the heater so that the relative distance L2 between the heating center of the heater and the surface of the raw material melt becomes larger, or reducing the distance L1 between the surface of the raw material melt and the heat insulating member. On the contrary, the temperature gradient G of a crystal can become smaller by spreading the diameter of the straight body, decreasing the rotation rate, decreasing the flow rate of an inert-gas, changing the position of the heater so that the relative distance L2 between the heating center of the heater and the surface of the raw material melt becomes smaller, or extending the distance L1 between the surface of the raw material melt and the heat insulating member.

Furthermore, in these cases, it has been also revealed that if at least two or more of the pulling conditions shown above are changed during pulling a single crystal, the temperature gradient G of the crystal can be controlled in a very wide range with extremely high precision, thereby a single crystal including a desired defect region can be grown at a high rate of stability. Namely, if only one parameter is changed, just the fluctuation of the temperature gradient G of the crystal shown in the respective figures can be obtained. However, if two or more parameters are changed and controlled in combination, the temperature gradient G of the crystal can be controlled at will and more effectively.

The present invention is what utilizes such a relation between the pulling conditions and the temperature gradient G of a crystal during pulling a single crystal.

Namely, the method for producing a single crystal according to the present invention is characterized in that, when a single crystal is grown by CZ method, the temperature gradient G of the crystal is controlled by changing at least two or more of pulling conditions including a diameter of the straight body of the single crystal, a rotation rate of the single crystal during pulling the single crystal, a flow rate of an inert-gas introduced into the chamber, a position of a heater heating the raw material melt, and a distance between the melt surface of the raw material melt and a heat insulating member provided in the chamber so as to oppose to the surface of the raw material melt, thereby V/G is controlled at a desired value so that a single crystal including a desired defect region is grown.

Hereinafter, the method for producing a single crystal according to the present invention will be explained in detail with reference to the drawings. However, the present invention is not limited thereto.

Figure 1:
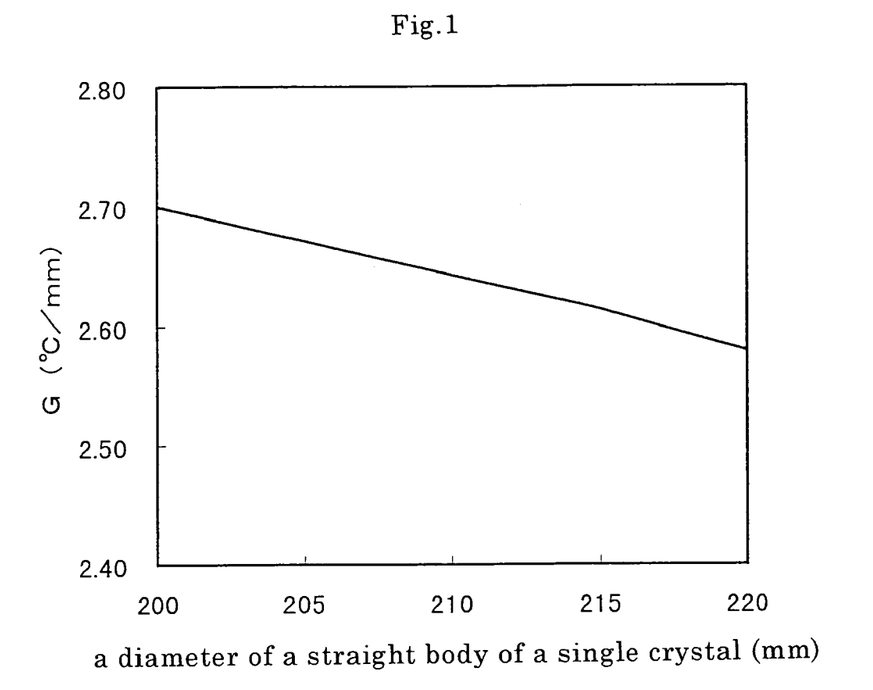
FIG. 1 is a graph showing an example of a relationship between a diameter of a straight body of a single crystal and a temperature gradient G of the crystal.
Figure 2:
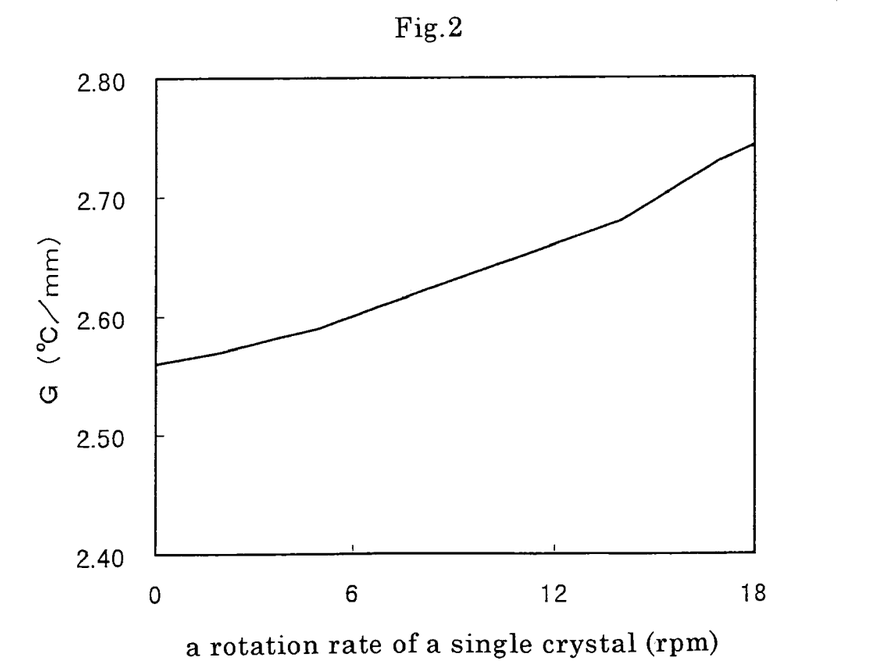
FIG. 2 is a graph showing an example of a relationship between a rotation rate of a single crystal and a temperature gradient G of the crystal.
Figure 3:
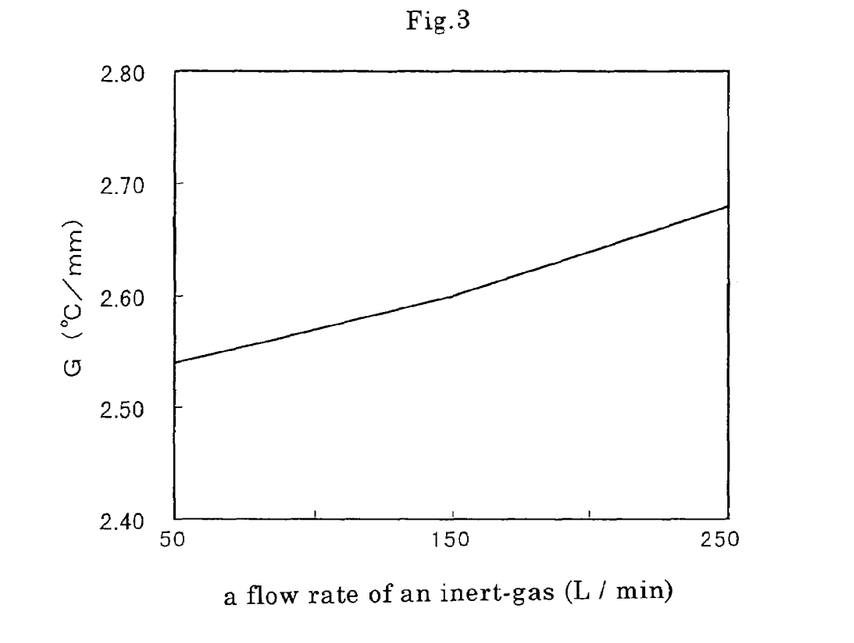
FIG. 3 is a graph showing an example of a relationship between a flow rate of an inert-gas and a temperature gradient G of the crystal.
Figure 4:
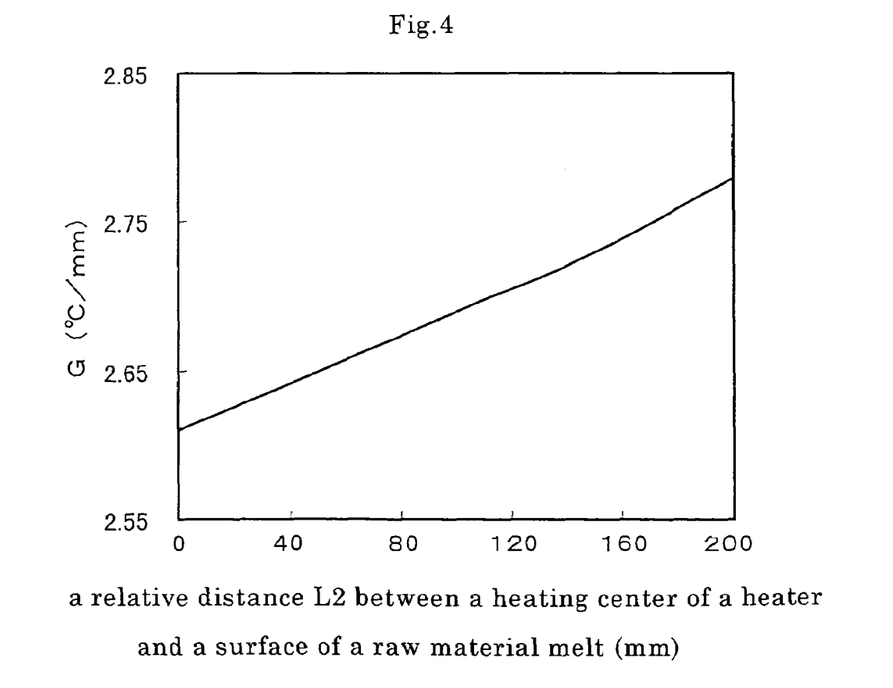
FIG. 4 is a graph showing an example of a relationship between a relative distance L2 between a heating center of a heater and a surface of a raw material melt and a temperature gradient G of the crystal.
Figure 5:
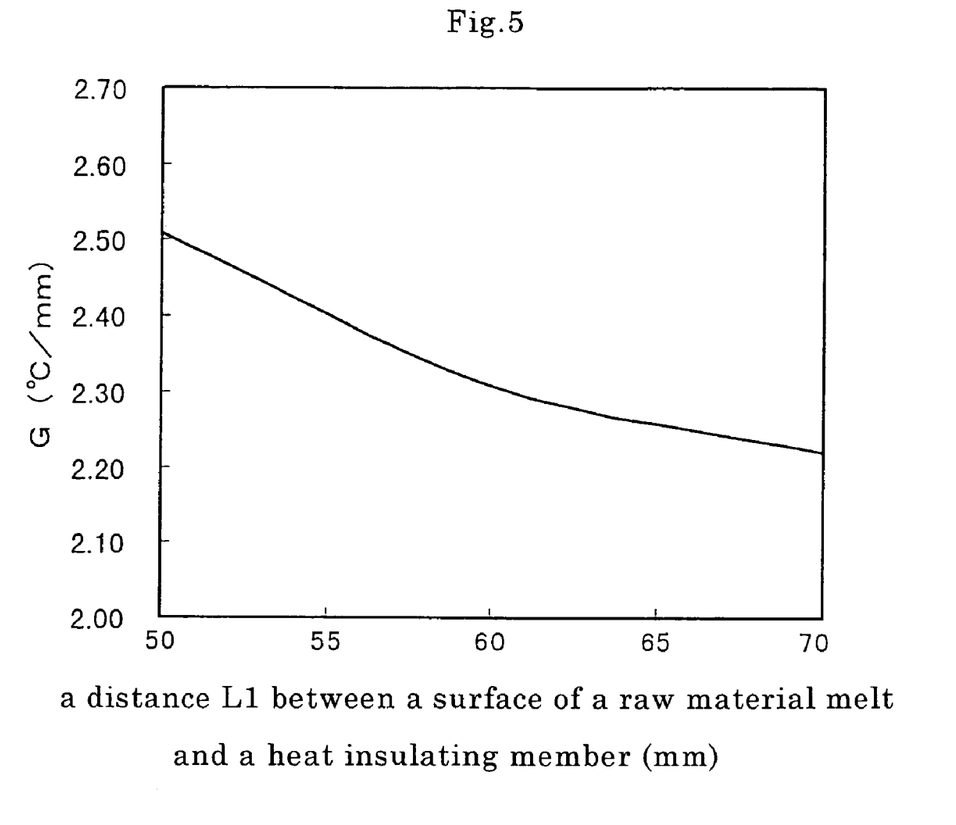
FIG. 5 is a graph showing an example of a relationship between a distance L1 between a surface of a raw material melt and a heat insulating member and a temperature gradient G of the crystal.
Figure 6:
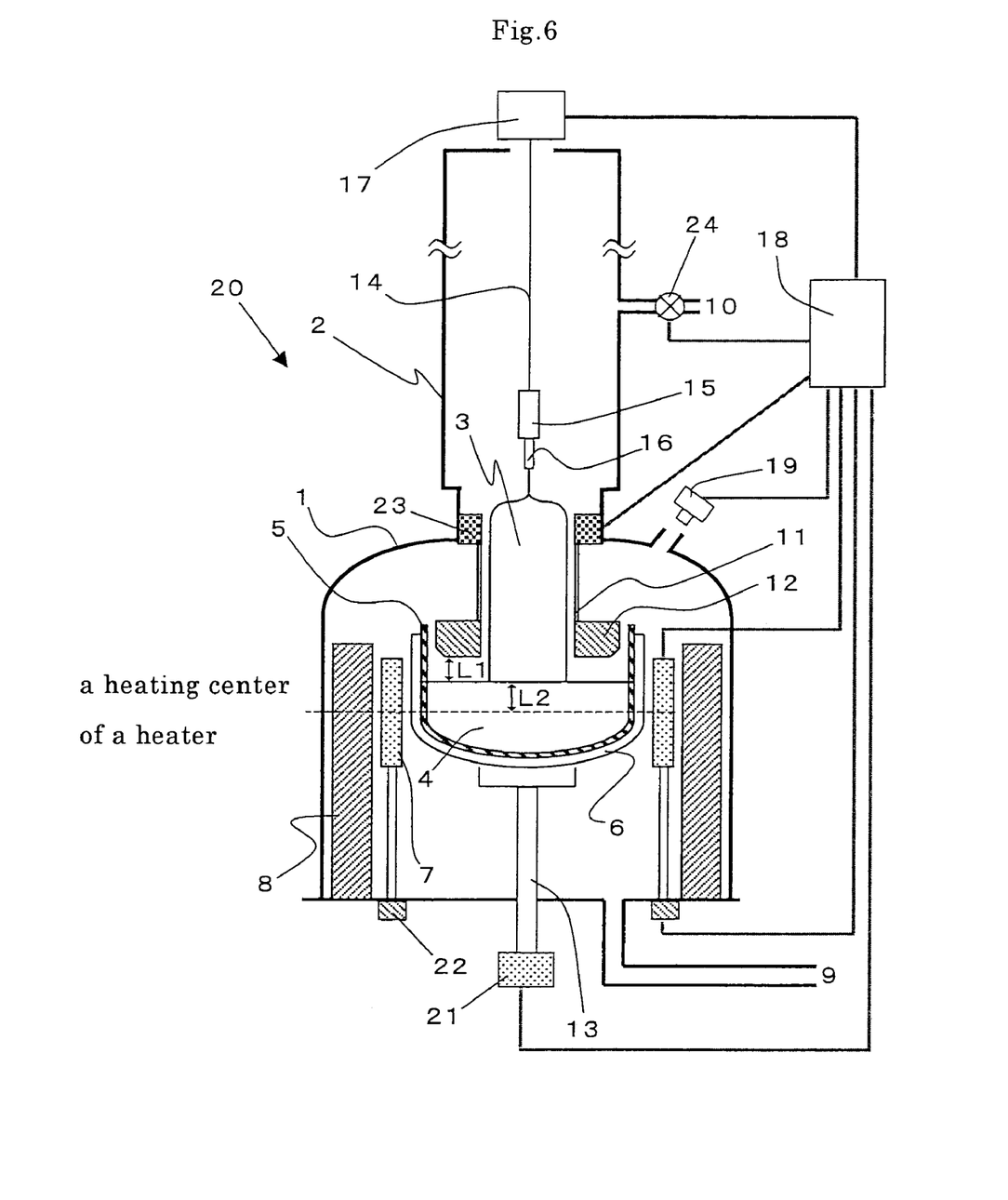
FIG. 6 is a schematic-view of a constitution of an example of an apparatus for pulling a single crystal that can be used for carrying out the method for producing a single crystal according to the present invention.

An apparatus for pulling a single crystal used in the method for producing a single crystal according to the present invention is not particularly limited as long as at least two or more of control of a diameter of a straight body of a single crystal, control of a rotation rate of a single crystal, control of a flow rate of an inert-gas, control of a position of a heater, and control of a position of a surface of a raw material melt and/or a heat insulating member can be performed during pulling the single crystal. For example, an apparatus for pulling a single crystal as shown in FIG. 6 can be used. First, with reference to FIG. 6, an apparatus for pulling a single crystal that can be used for carrying out the method for producing a single crystal according to the present invention will be explained.

As for the apparatus 20 for pulling a single crystal as shown in FIG. 6, in a main chamber 1, a quartz crucible 5 for containing a raw material melt 4 therein and a graphite crucible 6 for protecting the quartz crucible 5 are supported by a supporting shaft 13 so that the crucibles can be rotated and moved upwardly or downwardly by a driving mechanism 21 for the crucible. And, a heater 7 and a heat shielding member 8 are provided so as to surround these crucibles 5 and 6. Furthermore, a driving means 22 for the heater is provided so that the position of the heater 7 can be adjusted.

A pulling chamber 2 in which a grown single crystal 3 is stowed and from which the crystal is taken out is continuously provided from the top of the main chamber 1. At the top of the pulling chamber 2, a pulling mechanism 17 for pulling the single crystal 3 with rotating by a wire 14 is provided.

Furthermore, a gas flow-guide cylinder 11 is provided inside the main chamber 1. A heat insulating member 12 is provided at the bottom of the gas flow-guide cylinder 11, so as to oppose to the raw material melt 4 so that the heat radiation from the surface of the raw material melt 4 is intercepted and the temperature of the surface of the raw material melt 4 is kept. In addition, a driving means 23 for the heat insulating member is provided at the top of the gas flow-guide cylinder 11 so that a position of the heat insulating member 12 can be adjusted upwardly or downwardly by moving the gas flow-guide cylinder 11 upwardly or downwardly. And, in the present invention, form, material etc. of the heat insulating member 12 is not particularly limited and they can be changed properly if necessary. Furthermore, the heat insulating member 12 of the present invention is proper as long as it is provided so as to oppose to the melt surface, and the heat insulating member 12 is not necessarily limited to what is provided at the bottom of the gas flow-guide cylinder as shown above.

Further, an inert-gas like an argon gas can be introduced with adjusting a flow rate by a valve 24 from a gas inlet 10 provided at the upper portion of the pulling chamber 2. The gas passed through between the single crystal 3 being pulled and the gas flow-guide cylinder 11, and passed through between the heat insulating member 12 and the melt surface of the raw material melt 4. And then the gas can be discharged from a gas outlet 9.

In addition, the heater 7, the driving mechanism 21 for the crucible, the driving means 22 for the heater, the driving means 23 for the heat insulating member and the valve 24 are connected with a control means 18 for pulling conditions. And data like a position of the heater 7, a position of the crucibles 5 and 6, a position of the heat insulating member 12, a flow rate of an inert-gas, a position of the surface of the raw material melt and a diameter of the single crystal 3 monitored by a CCD camera 19, a temperature of the raw material melt monitored by a radiation thermometer (not shown), and a pulled length of the single crystal obtained by the pulling mechanism 17, are fed back to the control means 18 for pulling conditions, and thus power of the heater 7, driving of the pulling mechanism 17, opening and closing of the valve 24, driving of the driving means 22 for the heater, and driving of the driving mechanism 21 for the crucible and/or the driving means 23 for the heat insulating member can be adjusted according to the pulled length of the single crystal etc., respectively so that each of a diameter of the straight body of the single crystal, a rotation rate of the single crystal during pulling the single crystal, a flow rate of an inert-gas introduced into the chamber, a position of the heater heating the raw material melt, and a distance L1 between the surface of the raw material melt and the heat insulating member can be controlled and changed with high precision.

For example, when a silicon single crystal is grown by CZ method using such an apparatus 20 for pulling a single crystal, with introducing an inert-gas (for example, argon gas) into the pulling chamber 2 and the main chamber 1 from the gas inlet 10, a seed crystal 16 fixed at a seed holder 15 is immersed into the raw material melt 4 in the quartz crucible 5. Then, after the seed crystal 16 is pulled calmly with rotating and a neck portion is formed, with spreading to a desired diameter, the silicon single crystal 3 having a subcolumnar straight body can be grown.

In the present invention, when the silicon single crystal 3 is thus grown, at least two or more of pulling conditions including a diameter of the straight body of the single crystal, a rotation rate of rotating the single crystal, a flow rate of an inert-gas introduced into the chamber 1 and 2, a position of the heater 7, and a distance L1 between the surface of the raw material melt and the heat insulating member 12 are changed in the direction of the crystal growth, thereby the temperature gradient G of the crystal in the direction of pulling axis at the vicinity of solid-liquid interface can be controlled, and thus V/G can be controlled with keeping a pulling rate V constant without lowering the pulling rate V, thereby a single crystal including a desired defect region can be produced effectively for a short time.

In particular, for example, when a silicon single crystal is grown so that a defect region is N region over the whole plane in a radial direction, a pulling rate V is determined according to a production environment in which the single crystal is grown (for example, HZ of an apparatus for pulling a single crystal etc.) so that the straight body of the single crystal can be grown to be N region. At this time, the pulling rate V can be set to be a maximum value in a range in which a single crystal can be grown in N region.

Then, when a straight body of a single crystal is grown with thus determined pulling rate V, in a region in which the temperature gradient G of the crystal becomes smaller or conversely larger in the case of pulling the straight body without change, at least two or more of pulling conditions including a diameter of the straight body of the single crystal, a rotation rate of rotating the single crystal, a flow rate of an inert-gas introduced into the chamber 1 and 2, a position of the heater 7, and a distance L1 between the surface of the raw material melt and the heat insulating member 12 are changed, and thus the temperature gradient G of the crystal is controlled.

For example, in the region in which the temperature gradient G of the crystal becomes smaller, at least two or more of the pulling conditions are changed among narrowing a diameter of the straight body of the single crystal by adjusting an electric power etc. provided to the heater 7 to boost the heater power and to heat the raw material melt 4, increasing a rotation rate of the single crystal by the pulling mechanism 17, increasing a flow rate of an inert-gas introduced into the chamber by opening the valve 24, changing a position of the heater 7 by the driving means 22 for the heater (lowering the position of the heater) so that a relative distance L2 between the heating center of the heater 7 and the surface of the raw material melt becomes larger, and reducing a distance L1 between the surface of the raw material melt and the heat insulating member 12.

In addition, the distance L1 between the surface of the raw material melt and the heat insulating member can be changed with ease and with high precision, by lifting the quartz crucible 5 and the graphite crucible 6 with the driving mechanism 21 for the crucible at different speed with compensating the decline of the melt surface caused by growth of the crystal to move the melt level of the raw material melt upwardly or downwardly in the direction of the crystal growth axis, or by moving the gas flow-guide cylinder 11 upwardly or downwardly with the driving means 23 for the heat insulating member to move the position of the heat insulating member 12 upwardly or downwardly. And, although the case in which the heating center of the heater is lower than the level of the raw material melt is explained above as an example, it is clearly possible to control the heating center of the heater to be higher than the level of the raw material melt.

On the contrary, in the region in which the temperature gradient G of the crystal becomes larger, at least two or more of the pulling conditions are changed among spreading a diameter of the straight body of the single crystal by reducing the power of the heater 7, decreasing a rotation rate of the single crystal, decreasing a flow rate of an gas by closing the valve 24, changing a position of the heater 7 (elevating a position of the heater) so that a relative-distance L2 between a heating center of the heater 7 and the surface of the raw material melt becomes smaller, and extending a distance L1 between the surface of the raw material melt and the heat insulating member 12.

As described above, by changing at least two or more of aforementioned pulling conditions, without causing disadvantage that can arise in the case of changing only one pulling condition, a single crystal including a desired defect region can be grown at a high rate of stability with controlling the temperature gradient G of the crystal in a very wide range with extremely high precision.

In particular, during growing a single crystal, for example, when the temperature gradient G of the crystal is controlled by changing only a diameter of the straight body of the single crystal, it is considered that the diameter of the straight body can be spread excessively to make V/G to be a desired value. As a result, stock removal is excessive when circumferential surface of cylinder of the single crystal is subjected to a grinding process after the growth of the single crystal to make the diameter of the straight body to be the desired value, which can lead to yield degradation. On the contrary, during growing a single crystal, when the diameter of the straight body is narrowed excessively to control V/G, it is impossible to secure enough stock removal for the subsequent grinding process, and thus disadvantage like generating failure of being small diameter can arise.

In addition, for example, when only a rotation rate of a single crystal is changed during growing the single crystal, there are possibilities of causing disadvantage that if the rotation rate becomes high excessively or becomes low excessively to make V/G a desired value, the shape of the straight body of the single crystal is deformed or degradation of quality distribution in the plane is generated, and which lead to decrease of yield. Furthermore, when only a position of the heater is changed, it is considered that if the position of the heater is changed too much, dislocation can be generated in the growing crystal, or it can be difficult to control a temperature of the raw material melt because the raw material melt can't be heated properly.

However, when growing a single crystal, according to the present invention, at least two or more of pulling conditions including a diameter of the straight body of the single crystal, a rotation rate of the single crystal, a flow rate of an inert-gas, a position of the heater, and a distance L1 between the surface of the raw material melt and the heat insulating member are changed. Thereby, the temperature gradient G of the crystal can be controlled in a very wide range without changing any one of the aforementioned pulling conditions excessively, and control precision and response of the temperature gradient G of the crystal to the change of the pulling conditions can be improved. Accordingly, V/G can be controlled with very high precision without generating any of the aforementioned disadvantage caused by excessive change of the pulling condition, and thus a single crystal including a desired defect region can be grown at a high rate of stability.

And, the present invention is satisfied with, during growing a single crystal, changing at least two or more of pulling conditions including a diameter of the straight body of the single crystal, a rotation rate of the single crystal, a flow rate of an inert-gas, a position of the heater, and a distance L1 between the surface of the raw material melt and the heat insulating member. And, the number of pulling conditions and parameter to be changed can be selected properly according to a production environment (for example, a structure of HZ) in which the single crystal is practically produced.

In addition, in the case-of changing the aforementioned pulling conditions, a control range of respective pulling conditions can be also determined properly according to the production environment for producing the single crystal etc., and the control range is not particularly limited. However, for example, if the pulling conditions are changed so excessively during growing a single crystal, there are possibilities that aforementioned various kinds of disadvantage are caused. Accordingly, during pulling a single crystal, it is preferable that respective pulling conditions are changed in a range in which the single crystal can be grown at a high rate of stability.

For example, during growing a single crystal, when changing a diameter of the straight body of the single crystal, it is preferable that a range of change of the diameter is from −5% to +5% of the center value of the change. As an example, when a single crystal with a diameter of 150 mm is produced, in consideration of stock removal when circumferential surface of the crystal is subjected to grinding process after the growth of the single crystal, it is preferable that a diameter of the straight body of the single crystal is changed in a range of around 152-160 mm (the center value of change is 156 mm) during growing the single crystal. Furthermore, in the case of a single crystal with a diameter of 200 mm, it is preferable that a diameter is changed in a range of around 202-216 mm (the center value of change is 209 mm). In the case of a single crystal with a diameter of 300 mm, it is preferable that a diameter is changed in a range of around 302-320 mm (the center value of change is 311 mm).

Moreover, in the case of changing a rotation rate of the single crystal, though it depends on a diameter of the single crystal to be pulled, for example, it is ideal that the rotation rate is changed in a range of 0.1-40 rpm, preferably in a range of 5-14 rpm. Hereafter, in the same way, it is ideal that a flow rate of an inert-gas is changed in a range of 10-2000 L/min, preferably in a range of 60-300 L/min. As for a position of the heater, it is ideal that the position of the heater is changed so that a relative distance L2 between the heating center of the heater and the surface of the raw material melt is changed in a range of 0-500 mm, preferably in a range of 10-200 mm, more preferably in a range of 30-100 mm. It is ideal that a distance L1 between the surface of the raw material melt and the heat insulating member is changed in a range of 1-500 mm, preferably in a range of 10-300 mm, more preferably in a range of 20 -200 mm.

As described above, according to the present invention, during pulling a single crystal, at least two or more of pulling conditions including a diameter of the straight body of the single crystal, a rotation rate of the single crystal, a flow rate of an inert-gas, a position of the heater, and a distance L1 between the surface of the raw material melt and the heat insulating member are changed to control the temperature gradient G of the crystal, thereby V/G can be controlled at a predetermined value without depending on a pulling rate V. Accordingly, during pulling a single crystal, V/G can be controlled with ease so that a single crystal including a desired defect region like N region is obtained with not lowering the pulling rate V as usual but keeping the pulling rate V a predetermined value or more, especially the maximum pulling rate by which the defect region is obtained. Naturally, in the present invention, it is not always necessary to keep the pulling rate V constant as long as the temperature gradient G of the crystal is controlled by changing at least two or more of aforementioned pulling conditions, thereby a single crystal is grown in a region of a desired defect region. However, as described above, if the pulling rate V is kept constant at the maximum pulling rate by which the desired defect region is obtained, productivity of a single crystal can be considerably improved.

Namely, in the method for producing a single crystal according to the present invention, in the case of pulling the straight body of the single crystal, because an average pulling rate of the crystal can be improved, the straight body of the single crystal can be grown in a shorter time than usual. Furthermore, because a pulling rate at the end of growing the straight body of the single crystal doesn't become low, time for pulling at the subsequent tailing process can be reduced, thereby a silicon single crystal with very high quality of which the whole plane in a radial direction is N region can be produced with high productivity. Moreover, because production time is shortened, possibility of generating dislocation in the crystal is reduced, and not only productivity but also yield can be improved. As a result of that, productivity of a single crystal is improved and cost can be reduced considerably, thereby a single crystal can be provided with very low price.

Furthermore, in the case of growing a single crystal, if the temperature gradient G of the crystal is controlled according to the present invention, controllability of V/G can be improved. Therefore, a single crystal can be produced with controlling V/G with high precision in a narrow region, for example, as shown in FIG. 7, like Nv region or Ni region in N region in which Cu deposition defect region is not included, thereby a single crystal with very high quality in which a desired defect region is included over the whole region in the direction of the crystal growth axis can be obtained at a high rate of stability.

In addition, in such a method for producing a single crystal according to the present invention, a state of the temperature gradient G of the crystal, a relation between the temperature gradient G of the crystal and respective pulling conditions etc. in a production environment in which the single crystal is produced, are examined beforehand by performing, for example, simulation analysis, experimental measurement, etc. Thereby, changing conditions like selection of pulling conditions to be changed or degree of changing the pulling conditions during pulling the single crystal can be obtained in detail.

And, thus obtained changing conditions is input beforehand to a control means 18 for pulling conditions shown in FIG. 6, and when pulling a single crystal, data like a position of the heater 7, a position of the crucibles 5 and 6, a position of the heat insulating member 12, a flow rate of an inert-gas, a position of the melt surface of the raw material melt and a diameter of the single crystal 3 monitored by a CCD camera 19, a temperature of the raw material melt monitored by a radiation thermometer (not shown), and a pulled length of the single crystal obtained by the pulling mechanism 17, are fed back to the control means 18 for pulling conditions, and thus the heater 7, the pulling mechanism 17, the driving mechanism 21 for the crucible, the driving means 22 for the heater, the driving means 23 for the heat insulating member, and the valve 24 can be adjusted by the control means 18 for pulling conditions according to the changing conditions. Thereby, respective pulling conditions are controlled and changed automatically according to the pulled length of the single crystal etc., and thus the temperature gradient G of the crystal can be controlled with high precision. Accordingly, V/G can be controlled automatically with high precision, thereby a single crystal including a desired defect region can be produced more easily and at a higher rate of stability.

Furthermore, in the method for producing a single crystal according to the present invention, in the case of producing single crystals by CZ method in plural batches successively, it is preferable that the changing conditions that change at least two or more of the pulling conditions during pulling the single crystal is adjusted among batches for producing the single crystal.

Generally, when production of a single crystal is repeated for plural batches, there is a case that a production environment like HZ changes among batches for producing the single crystal by a cause like degradatidon of parts comprising HZ of an apparatus for pulling a single crystal. Especially, many parts made of graphite are used as parts of HZ. Among them, a heater is usually a graphite heater, and temperature distribution changes gradually as it is used. And if a production environment changes among batches for producing the single crystal as described above, the temperature gradient G of the crystal also changes among batches for producing the single crystal.

Accordingly, in the case of producing single crystals for plural batches, if the changing conditions of the pulling conditions are adjusted among batches for producing the single crystal according to changes of a production environment etc. as described above, changes of a production environment can be compensated, and thus a single crystal with high quality can be produced at a high rate of stability without generating dispersed quality among batches for producing the single crystal. Concretely, a relation between values of respective pulling conditions controlled and changed and defect distribution in last batch is fed back, and production conditions on and after next batch can be adjusted.

Hereinafter, the present invention will be explained further in detail with reference to Example and Comparative Example, however, the present invention is not limited thereto.

EXAMPLE

Using an apparatus 20 for pulling a single crystal as shown in FIG. 6, 150 kg of polycrystalline silicon as a raw material was charged with a quartz crucible with a diameter of 24 inches (600 mm), and a silicon single crystal with orientation of <100> and oxygen concentration in the range of 22-23 ppma (ASTM'79 value) was grown by CZ method with flowing an argon gas from a gas-inlet 10 (The length of the straight body of the single crystal was around 120 cm.). In addition, a diameter of the straight body of the single crystal was more than 200 mm when the single crystal was grown so that the single crystal obtained finally had the diameter of 200 mm, in consideration of stock removal for circumferential surface of cylinder being subjected to grinding process after the growth of the single crystal.

Furthermore, as to pulling conditions during pulling the single crystal, a temperature gradient G of the crystal was examined by performing simulation analysis beforehand. Then, based on the result of the analysis, a diameter of the straight body of the single crystal, a rotation rate of the single crystal, a flow rate of argon gas, a position of a heater (a relative distance L2 between a heating center of the heater and the surface of the raw material melt), and a distance L1 between the surface of the raw material melt and a heat insulating member were controlled and changed to be values shown in below table 1 respectively by a control means 18 for pulling conditions during pulling the single crystal. At the same time, a pulling rate of the crystal was controlled to be constant on and after pulling 10 cm of the straight body of the single crystal, and the single crystal was grown to be N region in which no Cu deposition defect region was detected. And, the pulling rate was high at pulling 0 cm of the straight body because so-called a shoulder portion was pulled by which the growth was transferred from the portion of spreading diameter to the straight body. The shoulder portion is formed and then the growth is transferred to pulling the straight body. The pulling rate can be stabilized while pulling 10 cm or less of the straight body.

Next, circumferential surface of cylinder of the single crystal grown as described above was subjected to grinding process to adjust the diameter of the straight body to be 200 mm. And then, test wafers were cut from thus-obtained single crystal at intervals of 10 cm in the direction of the crystal growth axis, and the wafers were grinded and polished to produce test samples. Then, the test samples were tested in respect to crystal quality characteristics as shown below.

(1) A Test of FPD (V Region) and LSEPD (I Region)

The test samples were subjected to Secco etching for 30 minutes without stirring. Then, the plane of the wafer was observed with a microscope, and it was ascertained whether there were crystal defects.

(2) A Test of OSF

The test samples were subjected to a heat treatment at a temperature of 1100° C. for 100 minutes under a wet oxygen atmosphere. Then, the plane of the wafer was observed with a microscope and it was ascertained whether there were OSFs.

(3) A Test of Defect by Cu Deposition Treatment

An oxide film was formed on each surface of the test samples. Then, the test samples were subjected to Cu deposition treatment, and it was ascertained whether oxide-film defects were existed. Evaluation conditions at that time were as follows:

oxide film: 25 nm,
intensity of electric field: 6 MV/cm,
time of impressed voltage: 5 minutes.

(4) A Test of Oxide Dielectric Breakdown Voltage Characteristics

The test samples were subjected to a thermal oxidation treatment under a dry atmosphere. Thereby a gate oxide film with a thickness of 25 nm was formed, and on which a polysilicon electrode having an electrode area of 8 mm$^2$ and doped with phosphorous was formed. Then, voltage was applied to the polysilicon electrode formed on the oxide film to evaluate oxide dielectric breakdown voltage. At this time, current density in decision was 1 mA/cm$^2$.

Comparative Example

Using the same apparatus 20 for pulling a single crystal as above Example, 150 kg of polycrystalline silicon as a raw material was charged in a quartz crucible with a diameter of 24 inches (600 mm), and a silicon single crystal was grown by CZ method. At this time, a diameter of the straight body of the single crystal, a rotation rate of the single crystal, a flow rate of an inert-gas, a position of a heater (a relative distance L2 between a heating center of the heater and the surface of the raw material melt), and a distance L1 between the surface of the raw material melt and a heat insulating

TABLE 1

| a length of the straight body (cm) | a pulling rate (mm/min) | a diameter of the straight body (mm) | a rotation rate of the single crystal (rpm) | a flow rate of Ar gas (L/min) | a relative distance L2 (mm) | a distance L1 between the melt surface and the heat insulating member (mm) |
|---|---|---|---|---|---|---|
| 0 | 1.20 | 208 | 14 | 100 | 45 | 60 |
| 10 | 0.57 | 208 | 14 | 150 | 45 | 60 |
| 20 | 0.57 | 206 | 14 | 175 | 45 | 60 |
| 30 | 0.57 | 206 | 14 | 175 | 45 | 57 |
| 40 | 0.57 | 208 | 14 | 150 | 45 | 55 |
| 50 | 0.57 | 208 | 14 | 130 | 45 | 55 |
| 60 | 0.57 | 208 | 11 | 130 | 45 | 55 |
| 70 | 0.57 | 208 | 11 | 130 | 45 | 55 |
| 80 | 0.57 | 208 | 11 | 130 | 45 | 55 |
| 90 | 0.57 | 208 | 10 | 130 | 55 | 55 |
| 100 | 0.57 | 208 | 10 | 130 | 65 | 55 |
| 110 | 0.57 | 207 | 10 | 150 | 65 | 55 |
| 120 | 0.57 | 206 | 10 | 180 | 65 | 55 | member was fixed to be constant as shown in below table 2. A pulling rate was changed to be values shown in below table 2 during growing the single crystal, thereby the single crystal was grown to be N region in which no Cu deposition defect was detected.

Then, test wafers were cut from the obtained single crystal at intervals of 10 cm in the direction of the crystal growth axis, and the wafers were subjected to surface grinding and polishing to produce test samples. Then, the test samples were tested in respect to crystal quality characteristics in the same way as Example.

TABLE 2

| a length of the straight body (cm) | a pulling rate (mm/min) | a diameter of the straight body (mm) | a rotation rate of the single crystal (rpm) | a flow rate of Ar gas (L/min) | a relative distance L2 (mm) | a distance L1 between the melt surface and the heat insulating member (mm) |
|---|---|---|---|---|---|---|
| 0 | 1.20 | 208 | 14 | 100 | 45 | 60 |
| 10 | 0.55 | 208 | 14 | 100 | 45 | 60 |
| 20 | 0.53 | 208 | 14 | 100 | 45 | 60 |
| 30 | 0.52 | 208 | 14 | 100 | 45 | 60 |
| 40 | 0.53 | 208 | 14 | 100 | 45 | 60 |
| 50 | 0.54 | 208 | 14 | 100 | 45 | 60 |
| 60 | 0.55 | 208 | 14 | 100 | 45 | 60 |
| 70 | 0.55 | 208 | 14 | 100 | 45 | 60 |
| 80 | 0.55 | 208 | 14 | 100 | 45 | 60 |
| 90 | 0.55 | 208 | 14 | 100 | 45 | 60 |
| 100 | 0.54 | 208 | 14 | 100 | 45 | 60 |
| 110 | 0.53 | 208 | 14 | 100 | 45 | 60 |
| 120 | 0.51 | 208 | 14 | 100 | 45 | 60 |

As a result of performing tests of crystal quality characteristics in respect to the respective silicon single crystals produced in above Example and Comparative Example, none of the defects of FPD, LSEPD and OSF were detected and no defects detected by Cu deposition treatment were observed from 10 cm to the end of the straight body of both of the single crystals. Moreover, as to evaluation of oxide dielectric breakdown voltage characteristics, level of oxide dielectric breakdown voltage was 100% good chip yield.

Meanwhile, average pulling rates on and after pulling 10 cm of the straight body when the straight body of the single crystals were grown in Example and Comparative Example were calculated and compared, the average pulling rate in Example is larger by around 0.033 mm/min than that in Comparative Example.

In reference with above result, it has been found that in Example in which the pulling rate was kept constant to grow the single crystal, the single crystal of which crystal quality was equal or more than Comparative Example can be produced in a shorter time and more effectively than Comparative Example. In addition, the single crystals obtained in Example and Comparative Example were observed visually, no failure respect was observed in both of the single crystals. Thereby, it is confirmed that the single crystal of Example can achieve equal or higher yield than that of Comparative Example.

In addition, the present invention is not limited to the embodiment described above. The above-described embodiment is mere an example, and those having substantially the same structure as technical ideas described in the appended claims and providing the similar functions and advantages are included in the scope of the present invention.

For example, the above embodiment was explained in the case of growing a single crystal of N region. However, the present invention is not limited thereto, and a single crystal of a desired defect region like V region, I region and OSF region can be produced. Furthermore, although the present invention is preferably applicable to the case of producing a silicon single crystal, the present invention is not limited thereto, and the present invention is also applicable to produce a single crystal of compound semiconductor etc.

In addition, the method for producing a single crystal according to the present invention is not necessary limited to be carried out over the whole length of the straight body of the single crystal. The present invention includes the case that the temperature gradient G of the crystal is controlled over a portion of length of the straight body by changing two or more of aforementioned pulling conditions to pull the single crystal of a desired defect region. As described above, especially, there is a case that a pulling rate or a diameter is not stabilized in the region of 10 cm from the shoulder portion, which is the former half of the straight body. Therefore, it is preferable that the present invention is carried out on and after pulling 5 cm or 10 cm of the straight body in which the pulling rate or the diameter can become steady with ease.

The invention claimed is:

1. A method for producing a single crystal with pulling the single crystal from a raw material melt in a chamber by Czochralski method, wherein during growing the single crystal, where a pulling rate is defined as V (mm/min) and a temperature gradient of the crystal in the direction of pulling axis at the vicinity of a solid-liquid interface is defined as G (° C./mm) during growing a straight body of the single crystal, the temperature gradient G of the crystal is controlled by changing at least two or more of pulling conditions including a diameter of the straight body of the single crystal, a rotation rate of the single crystal during pulling the single crystal, a flow rate of an inert-gas introduced into the chamber, a position of a heater heating the raw material melt and a distance between a melt surface of the raw material melt and a heat insulating member provided in the chamber so as to oppose to the surface of the raw material melt, thereby V/G (mm$^2$/° C.·min) which is a ratio of the pulling rate V and the temperature gradient G of the crystal is controlled so that a single crystal including a first defect region is grown.

2. The method for producing a single crystal according to claim 1, wherein the single crystal is pulled with keeping the pulling rate V constant.

3. The method for producing a single crystal according to claim 2, wherein V/G is controlled so that the defect region of the single crystal to be grown is N region over a whole plane in a radial direction.

4. The method for producing a single crystal according to claim 3, wherein at least two or more of the pulling conditions are changed automatically according to changing conditions obtained by performing an experiment beforehand.

5. The method for producing a single crystal according to claim 4, wherein the changing conditions that change at least two or more of the pulling conditions are adjusted among batches for producing the single crystal.

6. The method for producing a single crystal according to claim 3, wherein the changing conditions that change at least two or more of the pulling conditions are adjusted among batches for producing the single crystal.

7. The method for producing a single crystal according to claim 2, wherein at least two or more of the pulling conditions are changed automatically according to changing conditions obtained by performing an experiment beforehand.

8. The method for producing a single crystal according to claim 7, wherein the changing conditions that change at least two or more of the pulling conditions are adjusted among batches for producing the single crystal.

9. The method for producing a single crystal according to claim 2, wherein the changing conditions that change at least two or more of the pulling conditions are adjusted among batches for producing the single crystal.

10. The method for producing a single crystal according to claim 2, wherein the raw material melt is a polycrystalline material such that a silicon single crystal is pulled as the single crystal.

11. The method for producing a single crystal according to claim 1, wherein V/G is controlled so that the defect region of the single crystal to be grown is N region over a whole plane in a radial direction.

12. The method for producing a single crystal according to claim 11, wherein at least two or more of the pulling conditions are changed automatically according to changing conditions obtained by performing an experiment beforehand.

13. The method for producing a single crystal according to claim 12, wherein the changing conditions that change at least two or more of the pulling conditions are adjusted among batches for producing the single crystal.

14. The method for producing a single crystal according to claim 11, wherein the changing conditions that change at least two or more of the pulling conditions are adjusted among batches for producing the single crystal.

15. The method for producing a single crystal according to claim 1, wherein at least two or more of the pulling conditions are changed automatically according to changing conditions obtained by performing an experiment beforehand.

16. The method for producing a single crystal according to claim 15, wherein the changing conditions that change at least two or more of the pulling conditions are adjusted among batches for producing the single crystal.

17. The method for producing a single crystal according to claim 1, wherein the changing conditions that change at least two or more of the pulling conditions are adjusted among batches for producing the single crystal.

18. The method for producing a single crystal according to claim 1, wherein the raw material melt is a polycrystalline material such that a silicon single crystal is pulled as the single crystal.

* * * * *